United States Patent [19]
Jain

[11] Patent Number: 5,711,818
[45] Date of Patent: Jan. 27, 1998

[54] METHOD FOR REMOVING SUB-MICRO PARTICLES FROM A WAFER SURFACE USING HIGH SPEED MECHANICAL SCRUBBING

[75] Inventor: Manoj Kumar Jain, Plano, Tex.

[73] Assignee: Texas Instruments Incorporated, Dallas, Tex.

[21] Appl. No.: 651,020

[22] Filed: May 21, 1996

Related U.S. Application Data

[63] Continuation of Ser. No. 389,534, Feb. 15, 1995, abandoned.

[51] Int. Cl.$^6$ ........................................................ B08B 7/04
[52] U.S. Cl. ............................ 134/6; 134/33; 15/88.2
[58] Field of Search ........................ 134/6, 32, 33, 134/34, 28, 153; 15/97.1, 88.2, 88.3; 156/636

[56] References Cited

U.S. PATENT DOCUMENTS

| | | | |
|---|---|---|---|
| 3,841,031 | 10/1974 | Walsh | 51/783 |
| 5,264,010 | 11/1993 | Brancaleoni et al. | 51/308 |
| 5,320,706 | 6/1994 | Blackwell | 156/636 |
| 5,551,986 | 9/1996 | Jain | 134/6 |

Primary Examiner—Robert J. Warden
Assistant Examiner—Saeed Chaudhry
Attorney, Agent, or Firm—James R. Harris; Richard A. Stoltz; James C. Kesterson

[57] ABSTRACT

A method for removing particulate contaminants from a semiconductor wafer is disclosed. A wafer 10 is held in a wafer holder 12 at cleaning station 14. Cleaning station 14 has a rinse fluid supply system 18 which supplies, e.g. deionized water, to the wafer surface during particle removal. A cleaning pad 20 is mounted on a platen 22, substantially in the plane of wafer 10. Platen 22 is coupled to a drive mechanism 24, which may for example be an electric motor, and drive mechanism 24 is coupled to station 14 by an engagement mechanism 26 which provides vertical displacement to engage pad 20 and wafer 10 for particle removal, and also provides a controlled pad contact pressure during particle removal. In operation, rinse fluid from 18 is supplied to slowly rotating wafer 10, while pad 20 is rotated, preferably at 200 to 600 rpm, and contacted with wafer 10. High pad speed appears to be particularly beneficial to cleaning, with pad contact pressure and contact time apparently being secondary effects which at least decrease wafer-to-wafer variances in the cleaning process.

20 Claims, 3 Drawing Sheets

METHOD FOR REMOVING SUB-MICRO PARTICLES FROM A WAFER SURFACE USING HIGH SPEED MECHANICAL SCRUBBING

This application is a Continuation of application Ser. No. 08/389,534, filed Feb. 15, 1995 now abandoned.

CROSS-REFERENCE TO RELATED APPLICATIONS

The following co-assigned patent applications are hereby incorporated by reference: Ser. No. 08/347,545, filed Nov. 30, 1994 to Roy et al., entitled "Post-Chemical Mechanical Planarization Clean-up Process Using Post-Polish Buffing"; Ser. No. 08/389,833 filed Feb. 15, 1995 to Jain, entitled "Mechanical Scrubbing for Particle Removal".

FIELD OF THE INVENTION

This invention relates generally to semiconductor processing and more specifically to the removal of particulate contaminants from semiconductor devices during fabrication.

BACKGROUND OF THE INVENTION

Semiconductor devices are built in manufacturing environments known in the art as clean rooms, which are specifically designed for the filtering and elimination of particulate contaminants. Particle control is vital to the success of semiconductor manufacturing and directly affects device yield, as a single "killer" particle adhering to a device surface may ruin an entire microelectronic circuit. Such "killer" particles need not be large, but are generally of a size at least half the width of conductor wirings and other circuit features. As such, a 0.2 micron particle adhering to a circuit with 0.8 micron features may rarely cause a malfunction, while the same particle adhering to a circuit with 0.35 micron features is much more likely to "kill" the circuit.

Despite the clean manufacturing environment, cleanup steps must generally be performed throughout the semiconductor manufacturing operation to remove particles from the wafers, or slices, upon which the circuits are fabricated. Cleanup steps are particularly important before critical processes such as lithography and after inherently dirty processes such as chemical-mechanical polishing (CMP). For instance, CMP machines typically used for planarizing or smoothing a semiconductor wafer surface employ a polish slurry containing generally sub-micron sized abrasive particles of a material such as silica or alumina. Hundreds to thousands of these particles, along with particles removed from a wafer itself during polishing, typically may be found on a polished wafer surface. These particles must be removed in a cleanup step or they may drastically affect device yield.

Many methods of cleanup are common to semiconductor processing, including acid rinses, rinses with deionized (DI) water or surfactant solutions, and ultrasonic, brush, or mechanical buffing cleaning using such rinses and solutions, and combinations of these. For instance, U.S. Pat. No. 5,320,706, issued Jun. 14, 1994 to Blackwell, discloses a method for removing polish slurry particles from a semiconductor wafer by polishing the wafer with a polishing pad while a mixture of DI water and a surfactant is applied to the wafer and the pad. This method is apparently capable of reducing the number of residual particles on a 5" wafer to about 100 of 0.5 micron size and larger. Unfortunately, particle count varies roughly exponentially with particle size; that is, if 100 0.5 micron particles remain on a wafer after cleaning, it is likely that a thousand or more 0.2 micron particles remain also, each of which is capable of killing a 0.35 micron feature size circuit. Much more effective cleaning methods are required as circuit feature sizes continue to shrink, if acceptable yields are to be maintained.

SUMMARY OF THE INVENTION

The present invention provides a method and apparatus for removing particulate contaminants from a semiconductor wafer surface. This is apparently the first invention which can repeatedly reduce the number of 0.2 micron-and-larger particles on the surface of 6" diameter wafers to about 10 or less, for wafers which initially contain up to many thousands of such particles. Thus one advantage of the present invention is a heretofore unknown level of particle removal effectiveness, both in level of particle removal and wafer-to-wafer repeatability. Another advantage of the present invention is a simplification of the cleanup process, since the present invention may obviate the need for large, expensive cleaning equipment, serialized cleaning processes, and long cleaning times. Still another advantage of the present invention in at least one embodiment is the elimination of hazardous chemicals from the cleanup process while still providing an effective cleaning.

It has now been discovered that, for example, a small cleaning pad operating at high rpm may surprisingly remove submicron contaminants from a semiconductor wafer much more effectively than other known methods of particle removal. Although not well understood, it has now been observed, e.g., that buffing a 6" wafer with a 4.5" pad operating at roughly 200 rpm and above, concurrent with wafer rinsing using a rinse liquid such as DI water, was able to remove particles far more effectively than the same pad with the same rinse at lower rpm, even if the lower rpm was combined with higher pad pressures or much longer cleaning times. It is believed that the unexpected success of this invention may be due to the high rpm and the particular cleaning configuration, which does not clean the whole wafer simultaneously but instead uses a pad which only partially overlaps the wafer during cleaning.

It is not known to what extent the spinning pad physically contacts the wafer during cleaning, and to what extent contact between the pad and wafer is provided by a layer of rinse fluid between them. As used herein, contact or contacting comprehends any combination of physical and fluid layer-induced contact.

In one aspect of the invention, a method is provided for removing particulate contaminants from a chemically-mechanically polished semiconductor wafer surface comprising the steps of contacting a portion of the wafer surface with a cleaning pad and rotating the cleaning pad at a rotational velocity sufficient to provide a tangential velocity at the pad edge greater than 4 ft/sec. The method may further comprise supplying a rinse fluid to the wafer surface and/or the cleaning pad before, during, and/or after the contacting and rotating step.

The method may further comprise rotating the wafer, e.g. in a wafer holder during the contacting step. The contacting step may comprise holding the wafer and cleaning pad together with a pressure greater than 1 lb/in$^2$. Although some benefit has been observed for longer contact times, a preferred duration for the contact step is less that 20 seconds. The rinse fluid may comprise, e.g., deionized water, a surfactant, pH adjusters such as KOH or NH$_4$OH, or combinations of these. A preferred cleaning pad has a polymeric top surface. The pad may further comprise a resilient layer underlying the top surface (resilient meaning easier to compress than the top surface). The cleaning pad may have a top surface for contacting a wafer which is smaller than the wafer surface to be cleaned. Cleaning may purposely be combined with CMP as a means for cleaning wafers, by chemically-mechanically polishing to remove a contaminated top surface from a wafer and cleaning by a high speed buffing process as described above.

In another aspect of the invention, an apparatus for removing particulate contaminants from a semiconductor wafer surface is provided. This apparatus comprises a wafer holder capable of holding a wafer during particle removal, a cleaning pad, and a rinse fluid supply system for supplying rinse fluid to the surface of a wafer held in the wafer holder. This apparatus further comprises an engagement mechanism capable of holding a wafer held by the wafer holder and the cleaning pad in contact with a pressure of at least 1 lb/in$^2$, and a drive mechanism simultaneously capable of rotating the cleaning pad at a rotational velocity sufficient to provide a tangential velocity at the pad edge greater than 4 ft/sec. The cleaning pad is aligned with the wafer holder so as to leave a portion of the wafer exposed to the rinse fluid supply.

In some embodiments, the drive mechanism is capable of providing a tangential velocity under the specified conditions of greater than 7 ft/sec. The cleaning pad may be substantially planar (i.e. rotation is in the plane of cleaning) and substantially circular, such that the drive mechanism rotates the pad about its center. Some means of relative motion may be used to maneuver different areas of the wafer to contact the pad. This means may comprise rotationally coupling the wafer holder to the apparatus, such that a wafer may be rotated relative to the cleaning pad in the plane of contact.

BRIEF DESCRIPTION OF THE DRAWINGS

The present invention, including various features and advantages thereof, may be best understood by reference to the following drawing, wherein.

DETAILED DESCRIPTION OF THE PREFERRED EMBODIMENTS

The present invention, as described herein, comprises a method and apparatus for the removal of particulate contaminants from a semiconductor wafer. The present invention is described in relationship to a CMP cleanup, with the realization that the invention may be useful before or after other semiconductor operations. State-of-the-art particle counters currently cannot reliably detect particles smaller than 0.15 to 0.2 microns, therefore all particle counts discussed herein refer to particles 0.2 microns and larger. As a need for the removal of even smaller particles emerges, along with instruments for detecting such particles, it is expected that the invention described herein can be modified (e.g. by changing pad velocity) to remove such particles.

CMP of a semiconductor wafer generally leaves a slurry residue on the polished wafer surface, this residue typically comprising slurry liquid and thousands of particles. If the slurry liquid (or any replacement liquid) is allowed to evaporate from the wafer surface, the attached particles typically become much harder to remove; therefore, it is preferable that the wafer remain immersed in a suitable liquid or in a substantially saturated atmosphere until particle removal is complete, at which time the wafer may be dried, e.g. by spinning. In one respect, the coupling of the present invention with chemical-mechanical polishing may provide a synergism which results in improved cleaning due to the nature of the particles; e.g., CMP is believed to leave particles comprised mainly of wetted slurry particles, while removing other types of particles such as organics. It is also now believed that cleaning immediately after chemical-mechanical polishing may be beneficial in partical removal. Cleanup results for the processes mentioned herein also include a final step of a two-sided wafer scrub and spin dry. This step may be performed on a scrubber machine such as offered commercially by Ontrek, which uses cylindrical scrub brushes and a DI water rinse to clean both sides of a polished wafer.

Figure 1:
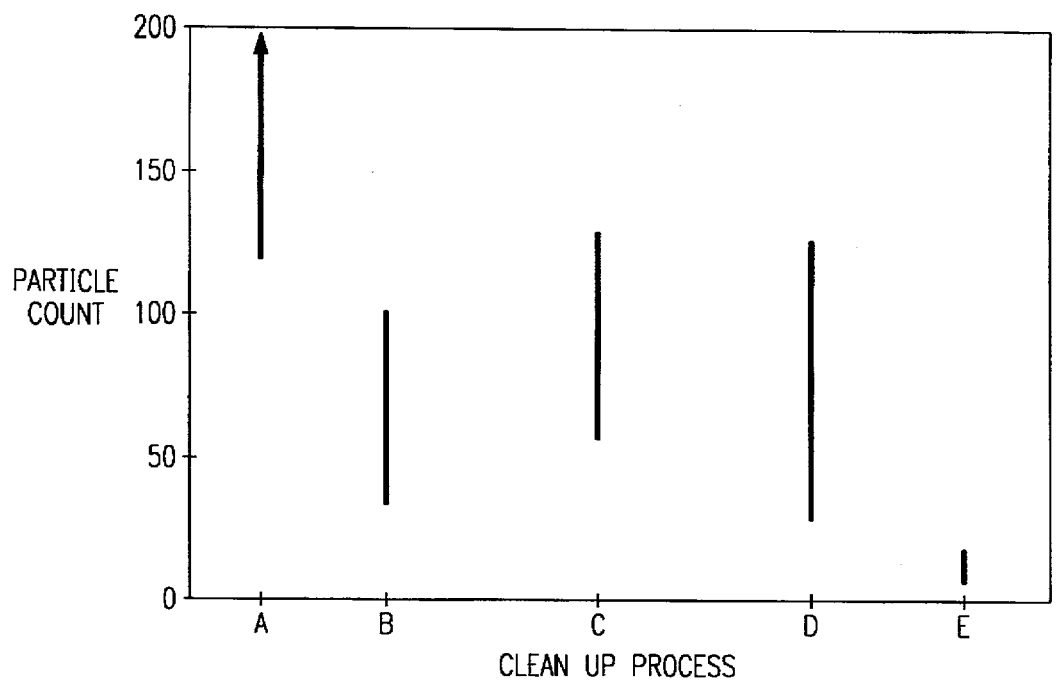
FIG. 1 illustrates typical particle counts observed after wafer cleaning by five different methods.

FIG. 1 illustrates typical ranges of residual particles remaining on a 6" wafer after several cleanup processes (each followed by Ontrek scrubbing). Process A is a DI water rinse of the wafer surface, typically comprising a stream of rinse fluid directed at the surface of a spinning wafer for about 30 seconds. This process has a high variability and typically leaves hundreds of particles on the wafer. Process B is a buffing step performed on a large, relatively slow-turning (i.e. below 80 rpm) pad and platen. Typically a rinse fluid such as DI water or a surfactant is supplied to the pad during buffing while the pad is rotated at 30–50 rpm and the wafer is rotated at a somewhat faster rpm. Cleaning pad pressures of 3–6 psi are typically used for 2–3 minutes, with resulting particle counts typically in the 35 to 100 range.

Process C is a buffing step performed on a small, relatively slow-turning pad and platen, such as found on the cleanup station of a commercially-available Strasbaugh 6DS-SP polishing machine. This process uses a wafer rotation rate of about 15 rpm in conjunction with a pad rotation rate of 75 rpm or less and a supply of a rinse liquid to the wafer surface. The pad is 4.5" in diameter, and cleaning pad pressures of about 1 psi are typically used for 2–4 minutes, with resulting particle counts typically observed from about 60 to the low hundreds.

Process D is an ultrasonic cleanup, such as may be performed with a Megasonic ultrasonic cleaning tank sold commercially by Verteq. This process typically uses one or more ultrasonic clean-and-rinse steps to lift particles from a wafer surface, and is currently a cleaning method preferred in the semiconductor industry.

Process E represents cleaning typical of the present invention. It can be appreciated from FIG. 1 that the present invention generally improves on cleaning as performed by other methods, and may be used to remove virtually all removable particles from a semiconductor wafer surface.

Figure 2:
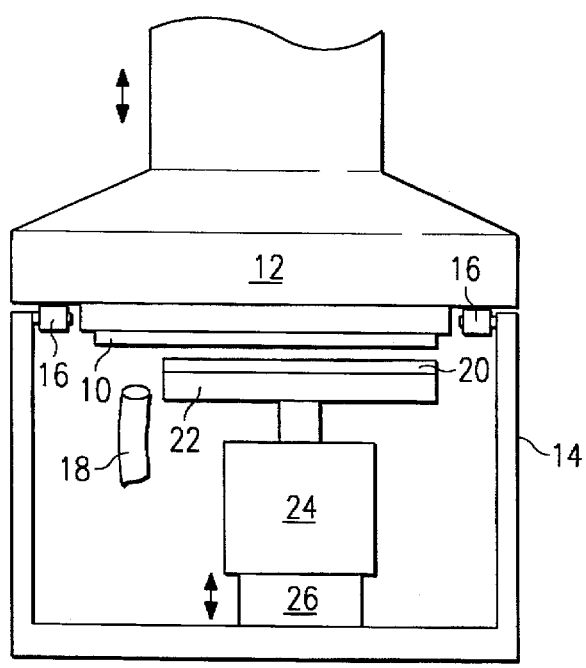
FIG. 2 shows a side view of a cleaning apparatus useful in the present invention.
Figure 3:
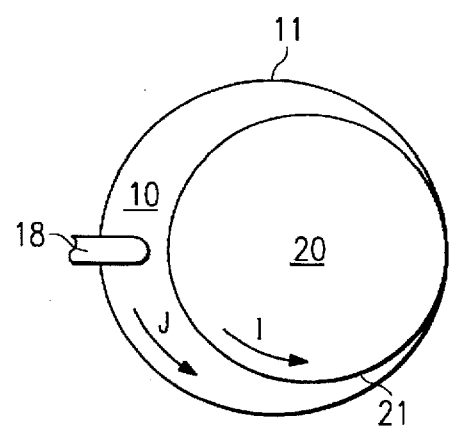
FIG. 3 shows a bottom view further illustrating the arrangement of cleaning pad, wafer, and rinse fluid supply system in the apparatus of FIG. 2.

An embodiment of the present invention is illustrated in FIGS. 2 and 3, wherein two major pieces of the apparatus are shown, a wafer holder 12 and a cleaning station 14. This apparatus represents a standard cleanup station as supplied on a Strasbaugh 6DS-SP polisher, with modifications according to the present invention. In this polisher, wafer holder 12 uses vacuum to hold wafer 10 during polishing and cleaning operations, and is capable of rotating wafer 10 as shown in FIG. 3. Cleaning station 14 comprises rollers 16 attached to station 14 such that holder 12 rests on and rotates on rollers 16 during cleaning. Station 14 further comprises a rinse fluid supply system 18, which during operation directs a stream, e.g. of DI water, and possibly containing other chemicals, towards the polished surface of wafer 10. A cleaning pad 20 is mounted to pad platen 22, which is substantially parallel to the polished surface of wafer 10. Pad 20 preferably comprises a two-pad stack, with a resilient underpad such as a Suba-4 and an upper pad typically of a polymeric composition such as a Polytex Supreme, both manufactured by Rodel. A pad stack which completely covers, or extends slightly beyond platen 22 is preferred. Pad platen 22 is mounted to drive mechanism 24, which must be capable of rotating the pad under pressure at relatively high rpm, as described herein. Finally, engagement mechanism 26 is fixed to drive mechanism 24 so as to control vertical motion of platen 22, thereby allowing for engagement and disengagement of pad 20 and wafer 10, as well as allowing control of pad contact pressure. Typically, some clearance exists between the disengaged pad and the wafer when holder 12 is resting on rollers 16.

Referring now to FIG. 3, the vertical alignment of some important components, as seen from below, is shown. In particular, a 6" wafer 10 and a 4.5" cleaning pad 20 are shown in one preferred arrangement, with the full pad in contact with the wafer and pad edge 21 nearly aligned with wafer edge 11 (at the 3 o'clock position in this figure). Directions of rotation are shown by arrows I and J, with both wafer and pad rotating counterclockwise in this embodiment. It can also be appreciated from the positioning of 18 that during operation rinse fluid will be directed at the polished surface of 10, primarily in the region not covered by 20.

Cleaning station 14, as supplied from the manufacturer, was not intended for use in a high performance particle removal system, but rather as a bulk slurry removal system. Originally, station 14 was fitted with a drive mechanism 24 consisting of a small air motor capable of less than 75 rpm under 1 psi pad pressure. This was replaced with a variable-speed electric motor which was capable of 600 rpm under 5 psi pad pressure in an embodiment of the present invention.

With the variable speed electric motor in place, experiments were performed with various combinations of pad rpm, pad pressure, buffing time, and rinse solution. These experiments consisted generally of about a 10 second wafer pre-rinse, followed by buffing for a predetermined period of time, followed by a 10 second wafer post-rinse, all performed while rotating the wafer at 15 rpm. After wafers were spun dry, particle measurements were conducted using a Tencor Instruments Surfscan 6400 surface scanner. Pad pressure was varied from about 1 psi to 4 psi (for a small pad, it was found that larger pressures may tend to break the wafer). Pad contact times were varied from 15 seconds up to 280 seconds in some cases. Pad rpm was selected in each experiment to be one of 60, 75, 90, 180, 240, 400, or 600 rpm. Most experiments were performed with DI water as the rinse fluid, although tests were also performed with $NH_4OH$ in a DI water solution.

It was found that increasing pad contact pressure resulted generally in decreased wafer-to-wafer particle variances for a given pad rpm, but appeared to show little, if any, decrease in mean particle count. It was also found that increasing pad contact time resulted generally in decreased wafer-to-wafer particle variances for a given pad rpm, but appeared to show little, if any, decrease in mean particle count. Particularly in the rpm range preferred in the present invention, pad contact times longer than 15 seconds in duration appeared to have negligible effect on after-buffing mean particle count. Improved cleaning was observed for DI water rinse liquid as compared to an $NH_4OH$ in DI water rinse liquid, for buffing at 75 rpm.

Figure 4:
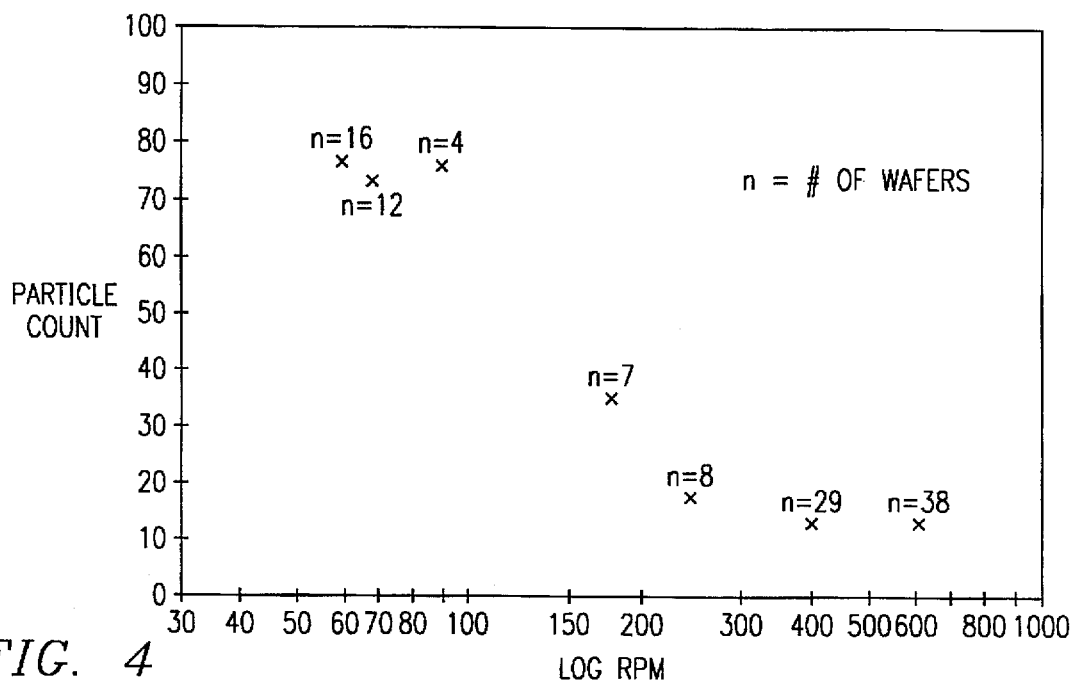
FIG. 4 contains a graph of particle count vs. rpm for tests conducted with the apparatus of FIG. 2.

However, as illustrated in FIG. 4, extremely surprising results were observed in general for high pad rotational velocity. FIG. 4 shows average particles per wafer as a function of pad speed, with n representing the number of wafers included in the average. At less than 100 rpm, best average particle counts were in the 70's, but as pad speed was increased above 200 rpm, a dramatic decrease in particle count was observed, with some 4 to 6 wafer lots achieving average particle counts as low as 10 particles/wafer. These results are particularly surprising when compared to a system which employs buffing on a large pad at 30–80 rpm. A large pad turning at 80 rpm may reach linear pad velocities at the point of wafer/pad contact comparable to the tangential pad edge velocities achieved with the 4.5" pad at 200 rpm, and yet such a large pad system is not known to produce particle counts as low as those achieved by the present invention.

Although not well understood, it is believed that a factor in the improved cleaning observed in the present invention may be related to the particular cleaning arrangement, which wets the wafer directly and directs the wafer under the edge of a spinning pad. In contrast, large table-type pads typically cover the entire wafer surface while cleaning, and supply rinse fluid to the pad only.

Although configuration is believed to play a part in the present invention, an important relationship has been found to exist between pad rpm and cleaning effectiveness for a 4.5" pad. Since pad speed as viewed by the wafer is a function of radial distance from the center of the pad, pads of different radii should require correspondingly different rpm for similar cleaning. A pad of a given radius, spun at a particular rpm, may be characterized by a tangential velocity at the pad edge, believed to be more particularly related than pad rpm to cleaning effectiveness. An especially preferred embodiment for 6" wafers uses a 4.5" diameter Suba-4/Polytex Supreme pad stack as described above, a 15 second pad contact time at approximately 2.5 psi pad pressure, a wafer rotational velocity of 5–20 rpm, a pad rotational velocity of 600 rpm (pad edge tangential velocity of 12 ft/sec), and a 25° C. DI water rinse fluid supply directed at the exposed wafer surface for a time period extending 10 seconds before pad contact and 10 seconds after pad disengagement. Generally, increased pad contact time and/or pressure produced somewhat better results. Results for 600 rpm tests are summarized in Table 1.

TABLE 1

| Pad Contact Pressure, psi | Pad Contact Time, seconds | Number of Wafers | Mean Particle Count | Particle Count σ |
|---|---|---|---|---|
| 2.5 | 15 | 24 | 14.3 | 7.7 |
| 2.5 | 40 | 6 | 10.7 | 8.0 |
| 2.0 | 60 | 4 | 11.3 | 3.3 |
| 3.9 | 60–120 | 4 | 12.5 | 0.8 |

Figure 9:
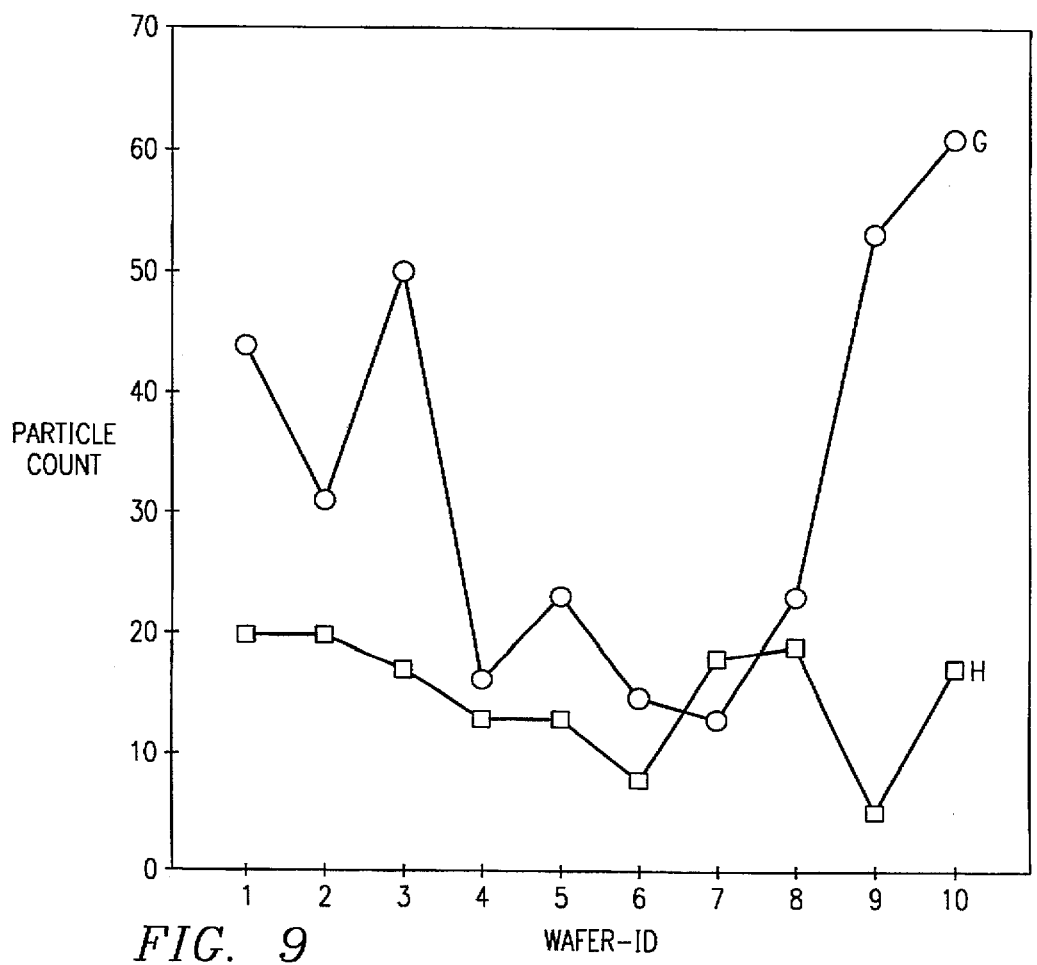
FIG. 9 compares particle counts for a series of wafers, after removal from an oxidation furnace and after CMP and cleaning according to the present invention.

Another advantage of the invention is wafer-to-wafer repeatability. Many systems suffer in performance after the first few wafers are cleaned. Results of a repeatability test for the current invention are shown in FIG. 9, wherein a lot of 10 6" wafers were processed serially through a cleaning station built and operated according to the present invention. A 6000 Å thermal oxide was grown on the 10 wafers in a furnace, and particles were counted after removal from the furnace. Line G shows measured particles after oxide growth, which is typically considered a clean process, for the 10 wafers to have a mean of 33 particles and a standard deviation of 18 particles. The wafers were subsequently polished in a CMP machine to remove 1700 Å of thermal oxide, and cleaned with a 15 second, 2.5 psi, 600 rpm cleanup in DI water, with 10 second pre and post wafer rinses. Particle counts for wafers 1 through 10, after CMP and cleanup, are represented by line H, with a mean of 15 particles and a standard deviation of 5 particles. Good cleaning was maintained from the first wafer to the last wafer. Surprisingly, 9 of 10 wafers were cleaner after CMP and cleanup according to the present invention than after thermal oxide growth, suggesting a combination of CMP and cleanup may both improve planarity and cleanliness for wafers after processes considered "clean" such as oxide growth or chemical vapor deposition.

Figure 5A:
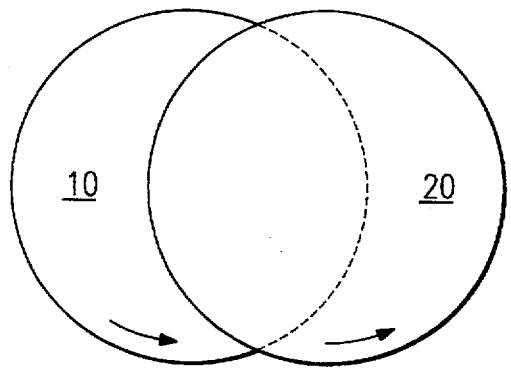
FIGS. 5A, 5B and 6-8 illustrate some other cleaning configurations which may be useful in the practice of the present invention.
Figure 5B:
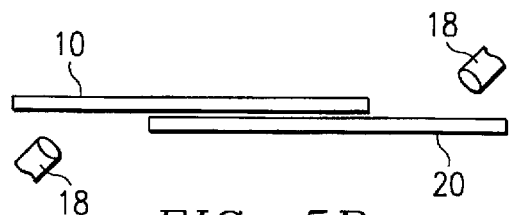

Using the teachings of the present invention, other particle removal systems may be constructed. For example, FIG. 5A shows a system wherein a pad 20, comparable in diameter to wafer 10, may be partially overlapped with wafer 10 and both spun during cleaning. As shown in FIG. 5B, such a system may allow the rinse fluid supply system 18 to simultaneously rinse both 10 and 20. Theoretically, pad rotational velocity for such a system may be decreased slightly from that desired for a smaller-than-wafer pad system, for similar performance.

Figure 6:
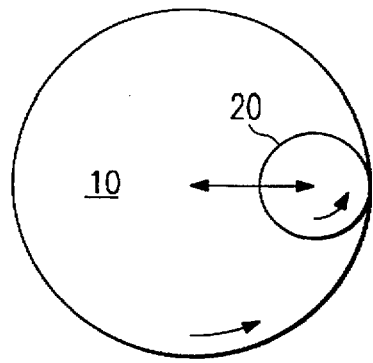
Figure 7:
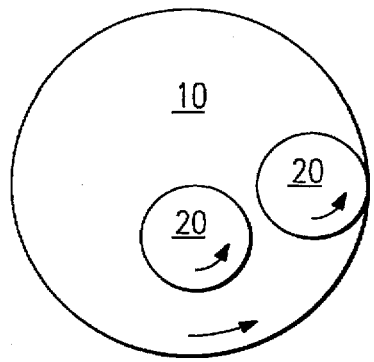

FIG. 6 shows a system with a pad 20 having a diameter less than half the diameter of wafer 10. In such a system, pad 20 and/or wafer 10 could be maneuvered to provide cleaning over the entire wafer surface. As shown, pad 20 could be moved laterally across a rotating wafer 10, for example, to achieve this result. This may be a very small and efficient system, as a 2.7" pad rotating at 1000 rpm has a pad edge tangential velocity equivalent to that of a 4.5" pad at 600 rpm. Alternately, as shown if FIG. 7, multiple small pads with overlapping coverage could be used in an embodiment.

Figure 8:
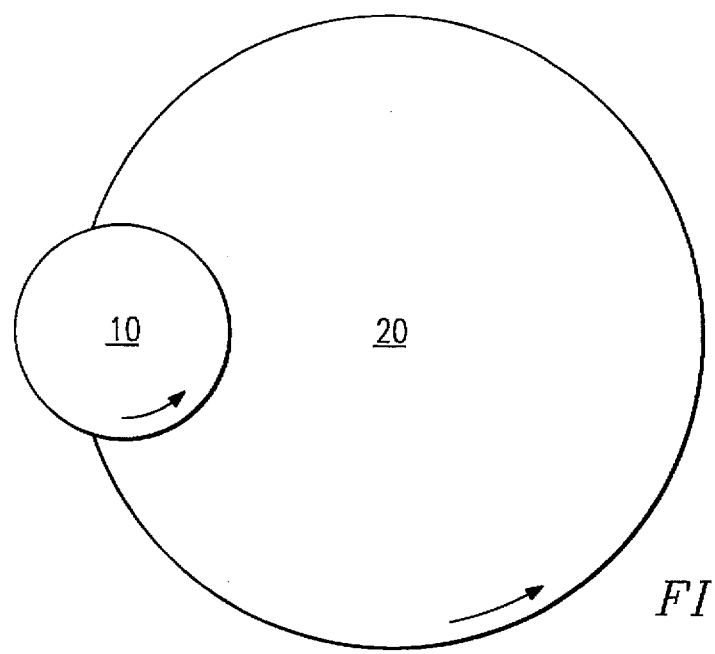

FIG. 8 shows a system with a pad 20 having a diameter more than twice that of wafer 10. Such a system could use multiple wafer holders to simultaneously clean two or more wafers. However, at 9" from the pad edge, to achieve the pad edge tangential velocity, e.g., of a 4.5" pad at 600 rpm, a table-type pad platen would have to spin at 150 rpm, and would probably require significant amounts of rinse fluid be supplied to the pad as well as the wafer.

Other modifications to these embodiments will be apparent to those skilled in the art upon reading this description. For example, the pad could be positioned over the wafer surface, instead of under, or the wafer could be cleaned in some arrangement other than horizontal. Pad and wafer could also counterrotate. Rinse fluid could be supplied through the pad platen in conjunction with fluid supplied directly to the wafer surface. Other means of engaging, disengaging, and controlling the pressure applied by the pad may be used, including simple gravity-induced pressure. Rinse fluid viscosity may have an effect on required rotational velocity; fluids at temperatures other than room temperature or fluids with viscosities significantly different than that of DI water at a given temperature are comprehended by the present invention. In principle, other means of producing the velocities taught herein for particle removal could be devised, which use a mechanism other than a spinning pad to remove particles.

What is claimed is:

1. A method for removing particulate contaminants from a chemically-mechanically polished semiconductor wafer surface, said method comprising contacting a first portion of said wafer surface with a cleaning pad having an outer edge and supplying a rinse fluid to a second portion of said wafer surface, while rotating said cleaning pad at a rotational velocity sufficient to provide a tangential velocity at said outer edge greater than 4 ft/sec.

2. The method of claim 1, wherein said contacting step comprises holding said wafer and said cleaning pad together with a pressure of at least 1 lb/in$^2$.

3. The method of claim 1, wherein said contacting step has a duration of less than 20 seconds.

4. The method of claim 1, wherein said cleaning pad comprises a polymeric top surface.

5. The method of claim 4, wherein said cleaning pad further comprises a resilient layer underlying said top surface.

6. The method of claim 1, wherein said cleaning pad comprises a top surface for contacting said wafer, said surface being smaller than said wafer surface.

7. The method of claim 1, wherein said rinse fluid comprises deionized water.

8. A method for removing particulate contaminants from a chemically-mechanically polished semiconductor wafer surface using a substantially circular cleaning pad having an outer edge, said method comprising contacting a first portion of said wafer surface and said cleaning pad with a contact pressure greater than 1 lb/in$^2$ and supplying a rinse fluid to a second portion of said wafer surface, while rotating said cleaning pad at a rotational velocity sufficient to provide a tangential velocity at said outer edge greater than 4 ft/sec.

9. The method of claim 8, wherein the magnitude of said tangential velocity exceeds 7 ft/sec.

10. A method for removing particulate contaminants from a chemically-mechanically polished semiconductor wafer surface using a substantially planar cleaning pad having an outer edge, said method comprising the steps of:

a) rinsing said wafer surface with deionized water; and b) contacting a first portion of said wafer surface and said cleaning pad with a contact pressure greater than 1 lb/in$^2$ and supplying deionized water to a second portion of said wafer surface, while rotating said cleaning pad at a rotational velocity sufficient to provide a tangential velocity at said outer edge greater than 7 ft/sec, while rotating said semiconductor wafer.

11. The method of claim 10, wherein said wafer is substantially circular and has a first diameter, and wherein said cleaning pad is substantially circular and has a second diameter, said second diameter having a magnitude less than twice said first diameter.

12. The method of claim 10, wherein said method is performed immediately after a chemical-mechanical polishing step.

13. A method for removing particulate contaminants from a chemically-mechanically polished semiconductor wafer surface, said method comprising contacting a first portion of said wafer surface with a cleaning pad having an outer edge and supplying a rinse fluid to a second portion of said wafer surface, while both rotating said cleaning pad at a rotational velocity sufficient to provide a tangential velocity at said outer edge greater than 4 ft/sec and rotating said wafer.

14. The method of claim 13, wherein said contacting step comprised holding said wafer and said cleaning pad together with a pressure of at least 1 lb/in$^2$.

15. The method of claim 13, wherein said contacting step has a duration of less than 20 seconds.

16. The method of claim 13, wherein said cleaning pad comprises a polymeric top surface.

17. The method of claim 16, wherein said cleaning pad further comprises a resilient layer underlying said top surface.

18. The method of claim 13, wherein said cleaning pad comprises a top surface for contacting said wafer, said surface being smaller than said wafer surface.

19. The method of claim 13, wherein said rinse fluid comprises deionized water.

20. The method of claim 13, wherein said method further comprises the steps of rinsing said wafer surface immediately prior to and immediately subsequent to said contacting step.

* * * * *